(12) United States Patent
Wheeler

(10) Patent No.: US 10,778,773 B2
(45) Date of Patent: Sep. 15, 2020

(54) MONITORING SYSTEM WITH LOW POWER DATA ACQUISITION

(71) Applicant: LO3 Energy Inc., Brooklyn, NY (US)

(72) Inventor: Zac Wheeler, Portland, OR (US)

(73) Assignee: LO3 Energy Inc., San Francisco, CA (US)

( * ) Notice: Subject to any disclaimer, the term of this patent is extended or adjusted under 35 U.S.C. 154(b) by 0 days.

(21) Appl. No.: 16/241,207

(22) Filed: Jan. 7, 2019

(65) Prior Publication Data

US 2019/0173954 A1    Jun. 6, 2019

Related U.S. Application Data

(63) Continuation of application No. 15/382,587, filed on Dec. 16, 2016, now abandoned.

(60) Provisional application No. 62/268,930, filed on Dec. 17, 2015.

(51) Int. Cl.
*H04L 29/08* (2006.01)
*G01R 19/25* (2006.01)

(52) U.S. Cl.
CPC .......... *H04L 67/12* (2013.01); *G01R 19/2513* (2013.01); *H04L 67/28* (2013.01)

(58) Field of Classification Search
CPC ............................ H04L 67/12; G01R 19/2513
See application file for complete search history.

(56) References Cited

U.S. PATENT DOCUMENTS

| | | | |
|---|---|---|---|
| 6,262,550 B1 | 7/2001 | Kliman | |
| 6,687,627 B1 | 2/2004 | Gunn et al. | |
| 7,986,968 B2 | 7/2011 | Dobrowski et al. | |
| 9,235,541 B2 | 1/2016 | Theile et al. | |
| 2007/0165656 A1 | 7/2007 | Dobrowski et al. | |
| 2016/0020719 A1* | 1/2016 | Tang ...................... H02P 27/06 | |
| | | | 318/798 |
| 2018/0165660 A1 | 6/2018 | High et al. | |

FOREIGN PATENT DOCUMENTS

| | | | | |
|---|---|---|---|---|
| WO | WO 2007/082015 | 7/2007 | | |
| WO | WO 2007/082018 | 7/2007 | | |
| WO | WO-2007082015 A2 * | 7/2007 | ............. | H04L 41/00 |
| WO | WO-2007082018 A2 * | 7/2007 | ............. | H04L 41/00 |

OTHER PUBLICATIONS

WO 2007082015, Jul. 19, 2007, 33 pp. (Year: 2007).*
WO 2007082018, Jul. 19, 2017, 32 pp. (Year: 2007).*

* cited by examiner

*Primary Examiner* — Toan M Le
(74) *Attorney, Agent, or Firm* — Fish & Richardson P.C.

(57) ABSTRACT

A system for monitoring electrical properties with lower power data acquisition.

20 Claims, 6 Drawing Sheets

MONITORING SYSTEM WITH LOW POWER DATA ACQUISITION

CROSS-REFERENCE TO RELATED APPLICATIONS

This application is a continuation of U.S. application Ser. No. 15/382,587, filed Dec. 16, 2016, which claims the benefit of U.S. Provisional App. No. 62/268,930, filed Dec. 17, 2015.

BACKGROUND OF THE INVENTION

The present invention relates a monitoring system with low power usage.

Referring to FIG. 1, a typical building environment includes many different pieces of equipment with that consume energy, such as motors, lighting, refrigeration, heating, air conditioning, and other industrial manufacturing devices. Each of these devices consumes energy which results in an overall cost to purchase the energy for these devices from a power source, such as a utility. Each of these devices also has an operational lifetime that can be extended by remaining within the designed operational parameters. With the ever increasing complexity of equipment and cost of such energy, there is significant pressure for an organization to monitor the energy usage and performance of the equipment so that equipment life may be extended and further cost effective energy reductions may be identified.

Demand side management programs have been deployed for large industrial environments resulting in replacing high energy consumption lighting devices with low energy consumption lighting devices, and replacing standard drive motors with variable frequency drive motors. While such replacement of energy consuming devices is one aspect of an energy conservation program, it does not provide an effective on-going monitoring of the energy consumption or the equipment's operational parameters.

Referring to FIG. 2, another monitoring system may involve installing a plurality of sensing devices, such as a power meter, each proximate a corresponding piece of equipment. Each of the power meters may include a set of sensors that sense the current and/or voltage provided to the respective power devices. Each of the power meters may include a set of registers that stores information regarding the current, voltage, phase, and/or power usage over time. A set of network cabling is provided from each of the power meters to a centralized power metering device or otherwise using a local wireless connection, such as IEEE 802.11 WiFi, to create a local network. The centralized power metering device may query each the power metering devices, as desired. In response to the query, the power meters provide responsive information to the centralized power metering device. In many cases, the centralized power metering device provides responsive information, to a centralized monitoring system, such as a management console using the Internet. Unfortunately, such a power monitoring system is expensive to install into existing infrastructures.

Similarly, operating devices with built-in sensors and diagnostic or control interfaces may be monitored by systems connected over a local network. They may also be monitored via telecommunications lines and modems that operators can dial in to in order to control the device directly, or modify or view the operational data of the device. These methods typically require human operator involvement to interact with and manipulate the device settings and view the registers. This is a time-intensive and expensive process, both when considering the cost of installing the monitoring infrastructure, and the personnel costs of operating such a fleet of devices when they extend into the thousands and tens of thousands.

The foregoing and other objectives, features, and advantages of the invention may be more readily understood upon consideration of the following detailed description of the invention, taken in conjunction with the accompanying drawings.

DETAILED DESCRIPTION OF PREFERRED EMBODIMENT

Figure 1:
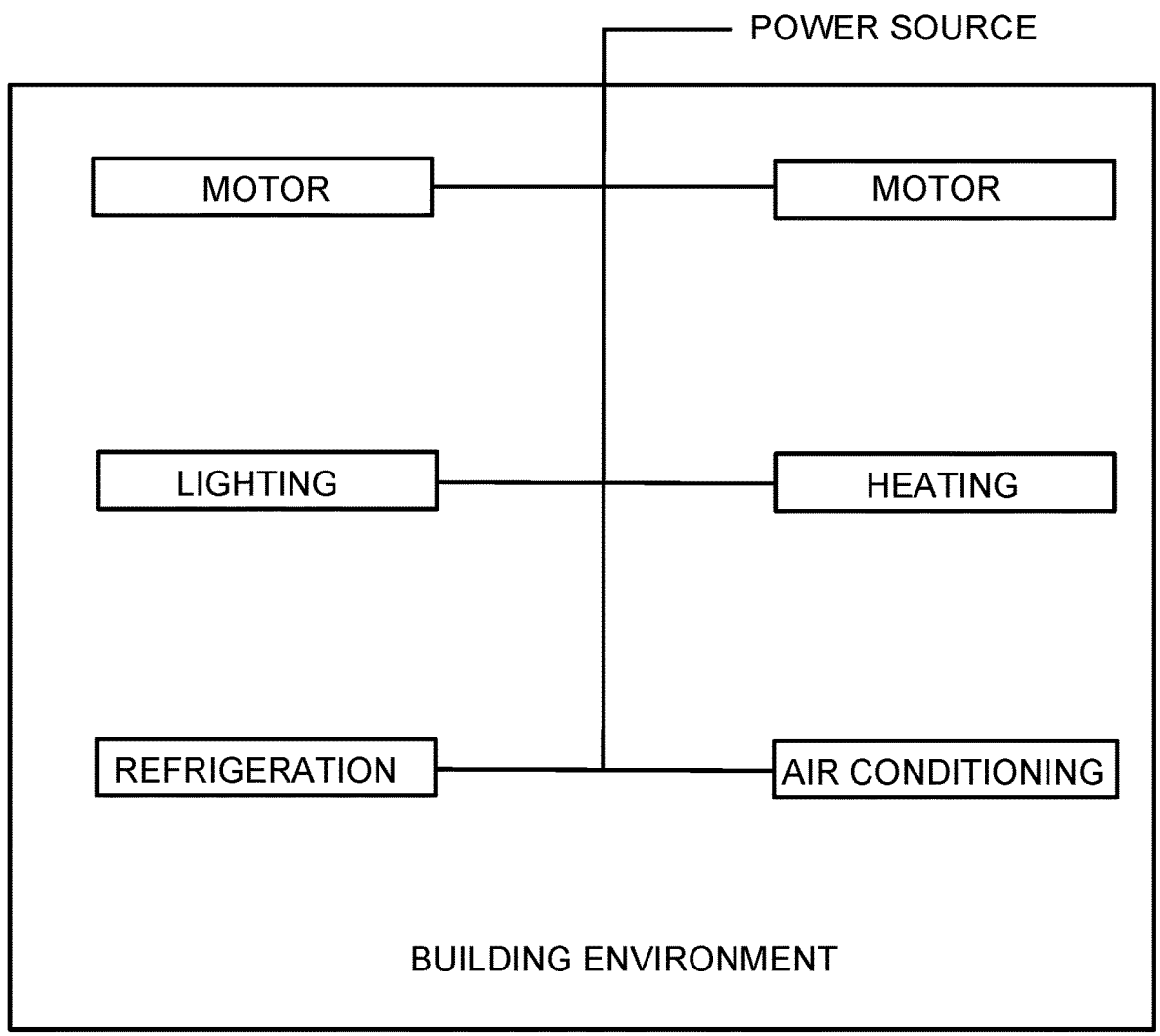
FIG. 1 illustrates a building environment including power consumption devices.
Figure 2:
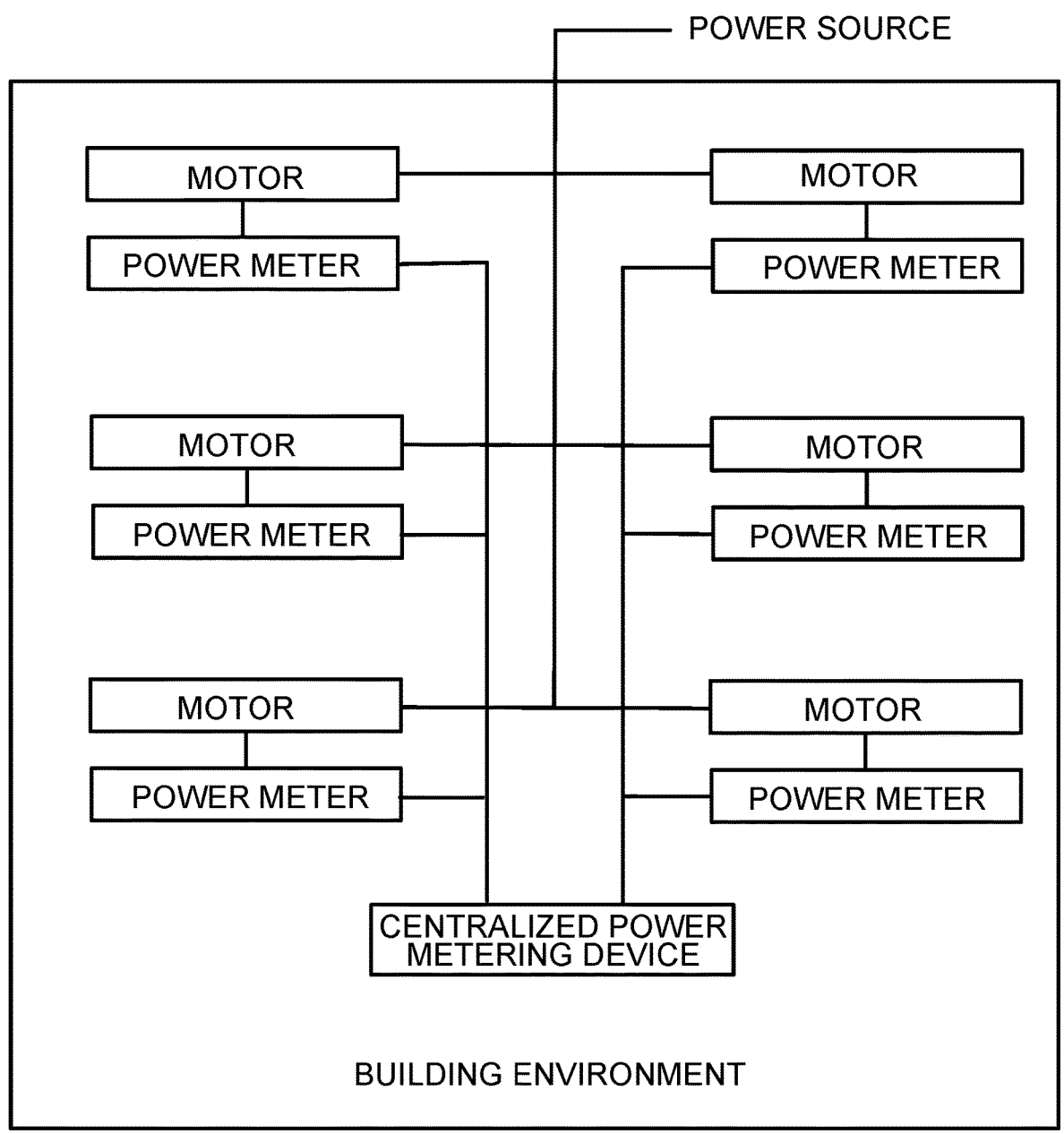
FIG. 2 illustrates a monitoring system for a building with various pieces of equipment.
Figure 3:
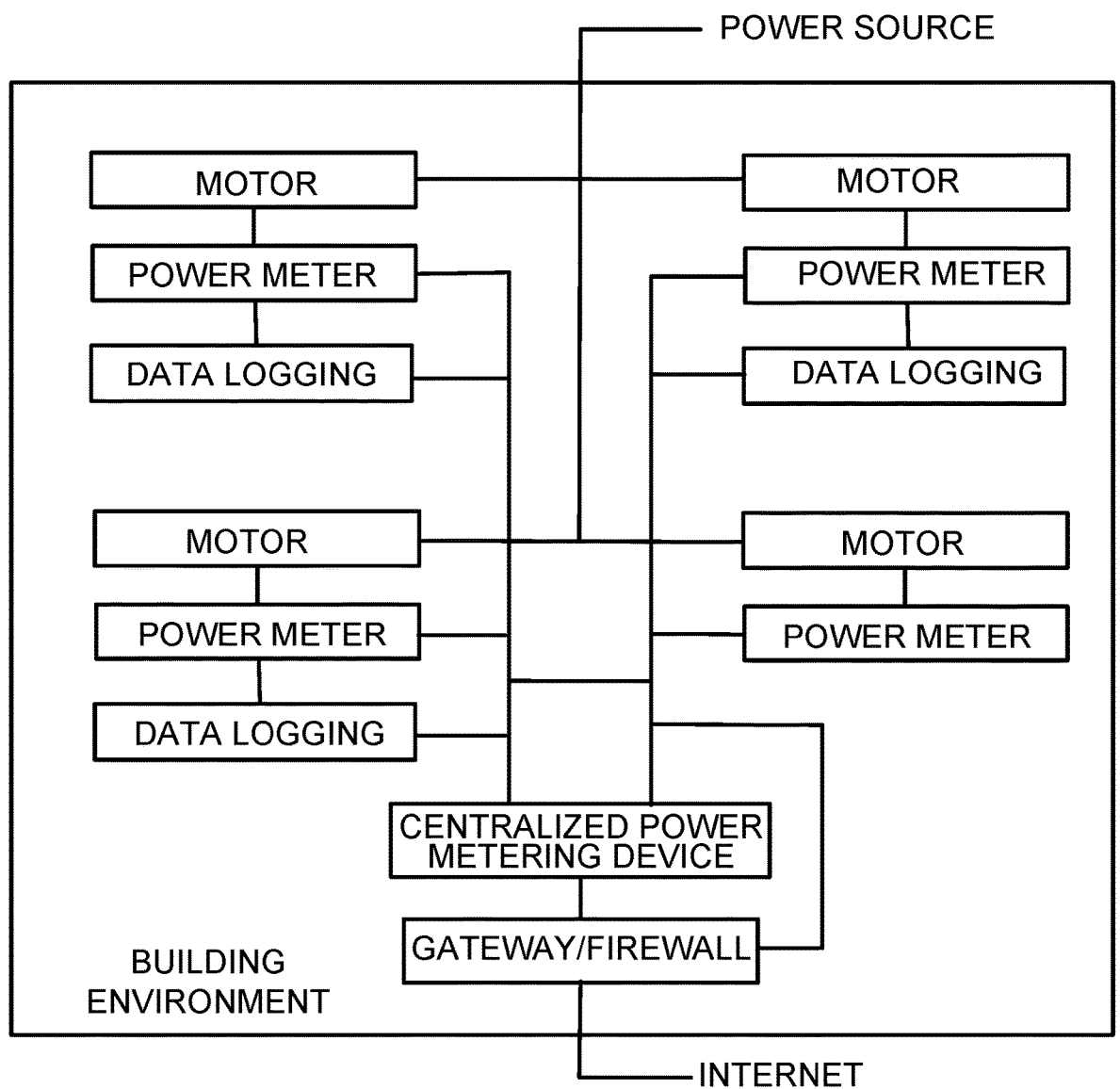
FIG. 3 illustrates a data logging system for a device.

Referring to FIG. 3, a modified building environment includes a plurality of pieces of equipment. The pieces of equipment may include, for example, a current sensor that senses the current to an energy device. The pieces of equipment may include, for example, a temperature sensor that senses the temperature in the plenum of a piece of equipment. The pieces of equipment may include, for example, an occupancy sensor that senses activity local to the sensor to determine whether the space is occupied. The pieces of equipment may include, for example, a power meter that senses the current and voltage to an energy device. The power meter, for example, may include a single phase, two phases, and/or three phases. The pieces of equipment may include, for example, a set of current sensors and a set of voltage sensors that measure the current, voltage, and/or power for a plurality of different energy devices. The pieces of equipment may include, for example, a boiler that heats water for use by the building occupants. The pieces of equipment may include, for example, an air conditioner that cools or dehumidifies the air within a building. The pieces of equipment may include, for example, a water chiller that cools water that is later circulated within the building to cool the air. Preferably, each of the pieces of equipment includes memory that stores data that is sensed, such as temperatures, pressures, flow rates, currents, voltages, apparent power, actual power, power factor, peak current, peak voltage, etc. In this manner, through a communications port, an external device can query the piece of equipment to obtain such data. By way of example, the energy monitoring device may include a RS485 interface and communicate using a MODBUS protocol, and/or include an Ethernet interface and communicate using a MODBUS or BACNET protocol.

One or more data logging devices may be interconnected to the piece of equipment. The data logging device is preferably located at a location that is either adjacent to the piece of equipment or otherwise interconnected to an internal network connected to the piece of equipment. For example, the data logging device may be directly connected to the piece of equipment. For example, the data logging device may be connected to the network connected to the piece of equipment. In either case, the data logging device may query and obtain information from the piece of equipment. In this manner, the data logging device is logically located within the network for the pieces of equipment, such as an RS485 network and/or an Ethernet network. By way of example, the network may include a firewall or otherwise an external gateway to the Internet, By way of example, the network may also include a computer or otherwise a computing device that can send and receive data from the pieces of equipment. By logically including the data logging device within the network, the data logging device does not need to be capable of sending and receiving data through the firewall and/or gateway to gain access to devices interconnected to the network. Furthermore, by logically locating the data logging device within the network, the IT (information technology) department is unlikely required to make modifications to its network to support the data logging device, which reduces the installation expenses related to the data logging device.

The data logging device may, based upon its configuration, query one or more pieces of equipment to obtain data regarding the energy usage. Accordingly, the data logging device may send a query to a particular piece of equipment. In response, the piece of equipment may provide a responsive set of data that is received by the data logging device. The data logging device may store the received data and modify the received data, as appropriate. The data logging device may receive data from a plurality of different pieces of equipment, and maintain the data for each of the pieces of equipment.

The data logging device may include a transmission device. To alleviate the need to create a logical pathway past the gateway and/or firewall associated with the network, the data logging device preferably transmits its signal in a wireless manner to a network not included within the network associated with the building (e.g., the network included in the building as defined by the gateway and/or firewall). Preferably, the data is transmitted using a wireless network, such as a cellular network, in order to send the data for subsequent processing. The transmitting of the data for subsequent processing may be performed on a periodic basis, an aperiodic but calculated basis determined through data modeling or network optimization routines or otherwise upon request. The data logging device may receive power from a wall power and/or a rechargeable battery and/or other power source.

The transmission of logged data by the data logging device is prone to error due to the amount of data that is being provided, and often the nature of noisy networks in industrial environments tends to exasperate the error rate. Also, the transmission of such data consumes the available bandwidth and incurs expenses for the data being transmitted. Further, the processing and transmission of substantial amounts of data requires substantially processing capabilities of the data logging device and consumes limited available power of the data logging device, which may be limited if using battery power.

For many loads, the power being provided to the load tends to be relatively consistent over time. For example, a motor operating in a steady state condition tends to consume a generally consistent amount of energy over time. Over time, based upon a variety of different factors, may loads tend to consume slightly less power and slightly more power, while still operating at a normal steady state condition.

The data logging device may obtain the power, voltage, and/or current conditions from the pieces of equipment. In addition, the power, voltage, and/or current conditions may further be obtained periodically over a temporal period of time. In general, the data logging device may obtain any type of electrical characteristics from the pieces of equipment.

Based upon the obtained electrical conditions from the pieces of equipment, the data logging device may determine an error band over which the electrical device operates. Also, based upon the obtained electrical conditions from the pieces of equipment provided by the data logging device, a network based computing device may determine an error band over which the electrical device operates which is provided to the data logging device. Preferably, the network based computing device is a cloud based service, such as Amazon Web Service, or otherwise a computer (e.g., computing device) interconnected to a network connection.

The error band may be selected by the data logging device based upon the fluxuations in the obtained electrical conditions. The error band may be selected by the network based computing device based upon the fluxuations in the electrical conditions from the pieces of equipment provided by the data logging device, where the network based computing device provides the error band to the data logging device.

The error band may be selected by the data logging device based upon a percentage change in the obtained electrical conditions. The error band may be selected by the network based computing device based upon a percentage change in the electrical conditions from the pieces of equipment provided by the data logging device, where the network based computing device provides the error band to the data logging device.

The error band may also be user selectable for the data logging device, if desired. The error band may be user selected by the network based computing device which is provided to the data logging device.

The data logging device may also include a selectable re-learn mode where the data logging device recalibrates the error band based upon additional obtained electrical conditions. The network based computing device may also include a selectable re-learn mode where the data logging device obtains electrical data from the pieces of equipment which is provided to the network based computing device which re-learns an error band, and the re-learned error band is provided to the data logging device.

The data logging device may also dynamically update the error band over time. The network based computing device may dynamically update the error band over time, which is provided to the data logging device.

Figure 4:
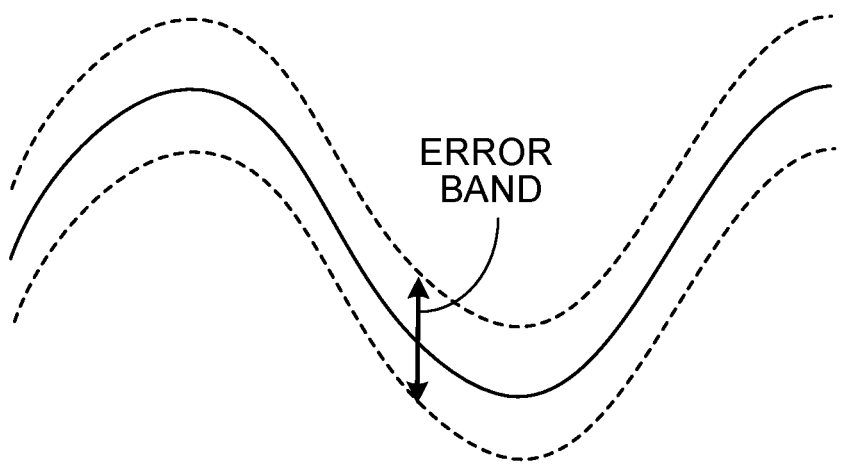
FIG. 4 illustrates an electrical signal and an error band.

Referring to FIG. 4, the error band may be based, for example, upon an alternating value of a temporal measure, such as the voltage, current, and/or power.

Figure 5:
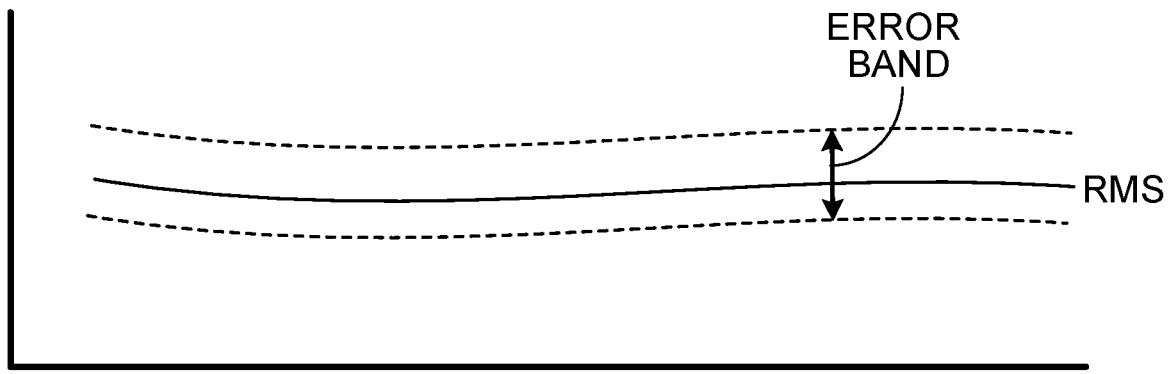
FIG. 5 illustrates another electrical signal and an error band.

Referring to FIG. 5, the error band may be based, for example, on a temporal root-mean-square or other statistical measure of a temporal measure, such as the voltage, current, and/or power.

Figure 6:
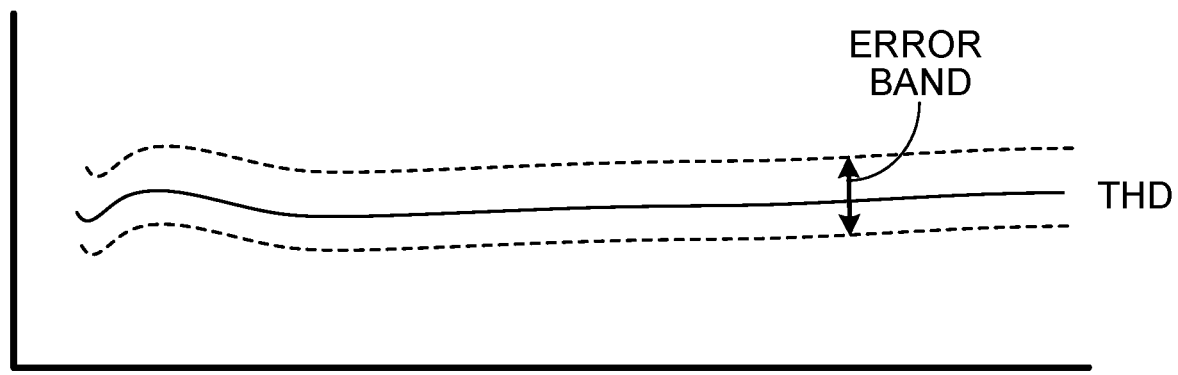
FIG. 6 illustrates another electrical signal and an error band.

Referring to FIG. 6, the error band may be based, for example, on a total harmonic power distortion of the power which is a measure of the sum of the powers of harmonic components to the power of the fundamental frequency.

Figure 7:
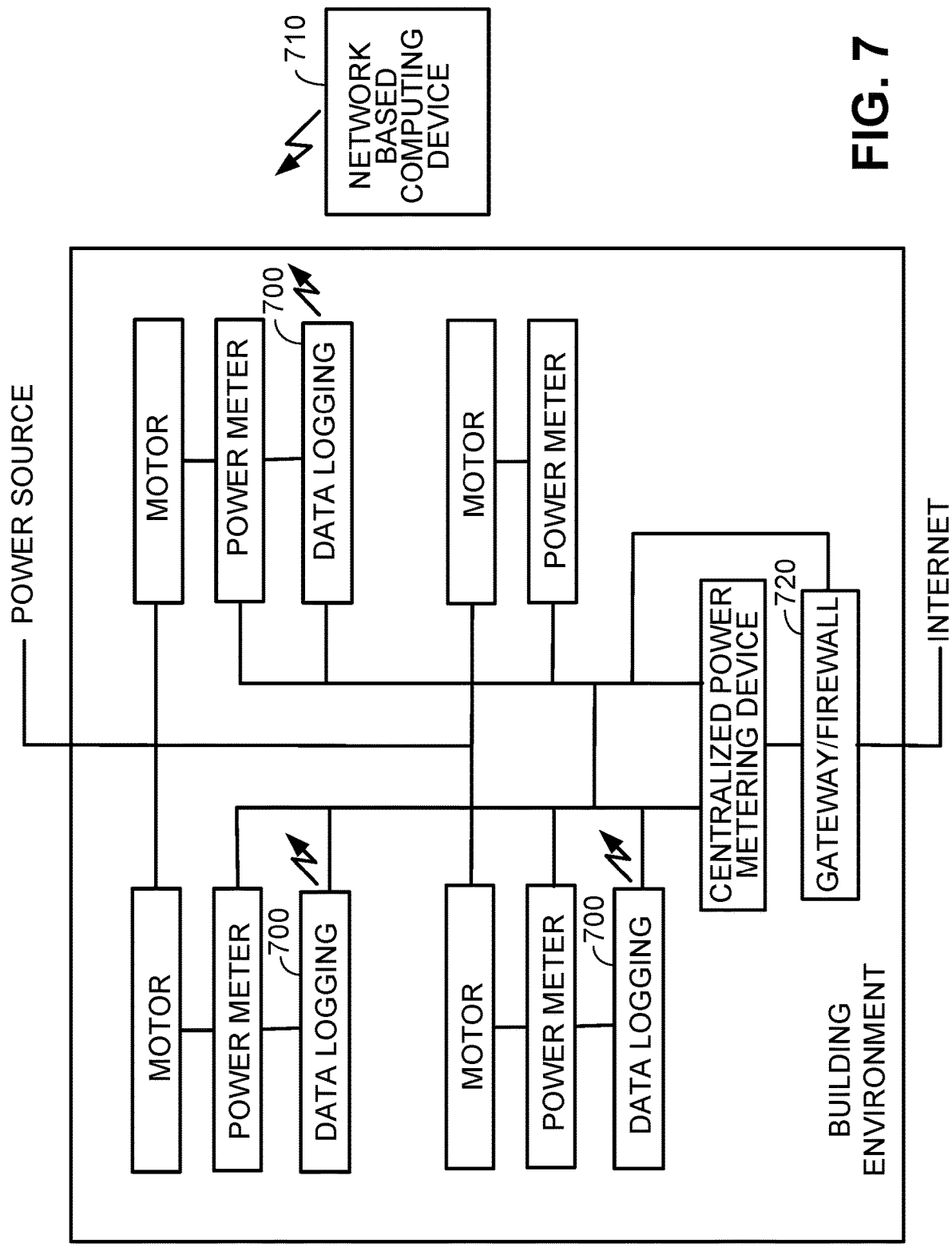
FIG. 7 illustrates a data logging system and a network based computing device.

Referring to FIG. 7, the data logging devices 700 and the network based computing device 710 may communicate with one another using a wireless network, such as the cellular network, that does not require passing such data through the gateway/firewall 720. The data logging device 700 and the network based computing device 710 may agree on what the expected electrical characteristics are under normal operating conditions including an error band. In general, the normal operating conditions may include any set of criteria that characterize the operation of the device, and include some variability in the set of criteria to account for normally expected changes in the normal operating conditions. The expected electrical characteristics and/or the error band may be exchanged between the data logging devices 700 and the network based computing device 710 so that each of the devices has the same expectations.

Figure 8:
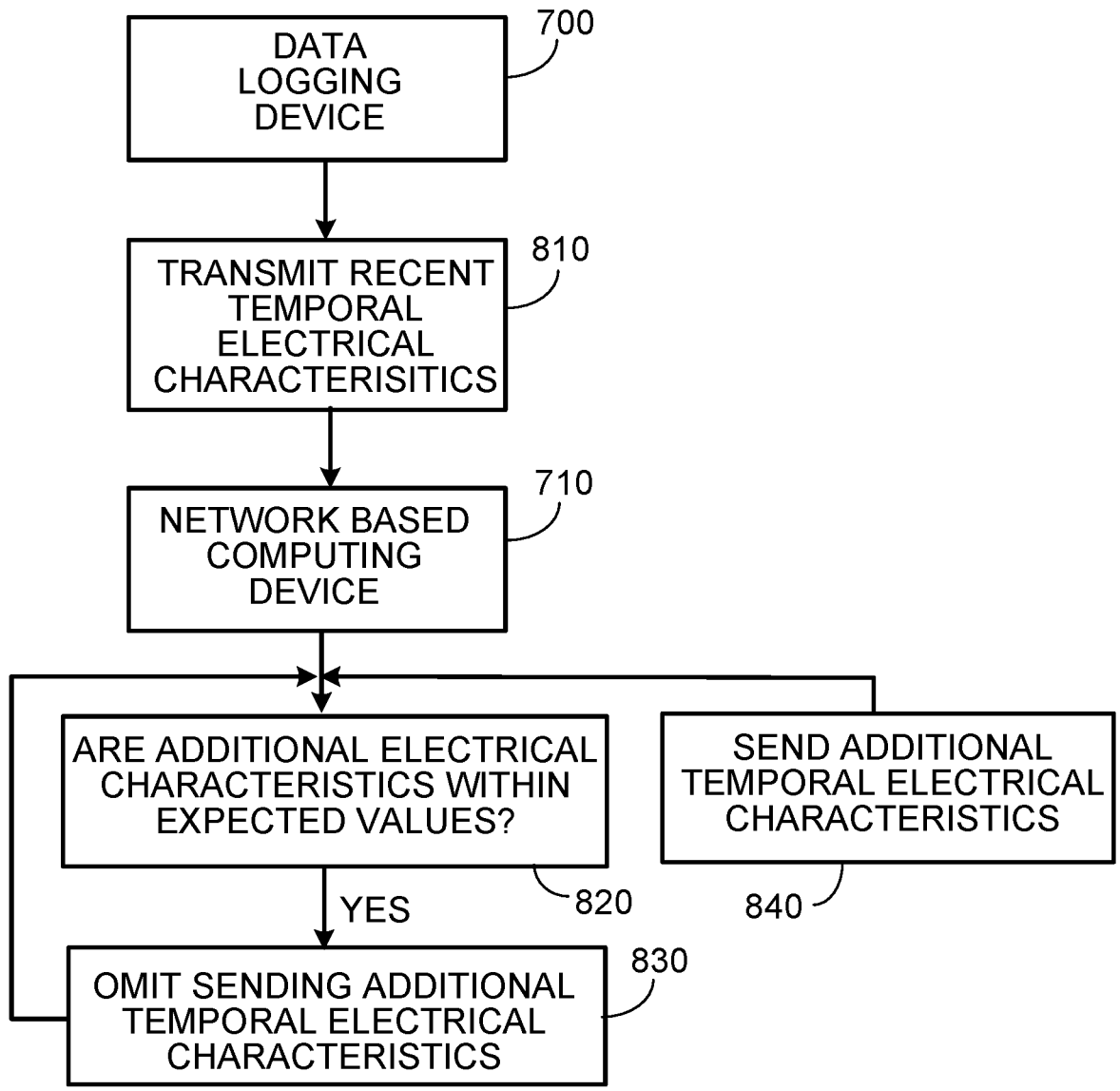
FIG. 8 illustrates selective data transmission from a data logging system.

Referring to FIG. 8, the communication between a data logging device 700 and the network based computing device 710 may include sending data for recent temporally obtained electrical characteristics 810. The data logging device 700 may obtain additional electrical characteristics from the electrical devices over time. If the additional electrical characteristics 820 that are sensed are within the expected values based upon the nominal operating conditions including the error band, then the data logging device 700 may omit sending 830 the additional electrical characteristics 820 to the data logging device 700, thus reducing the bandwidth requirements of the wireless network and decreases the errors associated with data transmission. The network based computing device 710 may presume, if no data is received, that normal operating continues persist even without such data being received. If the additional electrical characteristics 820 that are sensed are not within the expected values based upon the nominal operating conditions including the error band, then the data logging device 700 may send 840 the additional electrical characteristics 820 to the data logging device 700, thus sending electrical data when the data is not as anticipated under normal operating conditions.

This selective sending of the additional electrical characteristics reduces the bandwidth requirements of the system. The network based computing device 710, when no additional electrical characteristics are received, may use the previously received electrical characteristics as the basis to presume that the electrical device continues to consume power under normal operating conditions. When the operational characteristics of the electrical device sufficiently change, then additional temporal electrical characteristics will be provided to the network based computing device 710 by the data logging device 700, in which cases appropriate action may be taken as a result.

While the omission the transmission of all such additional electrical characteristics when they are within the expected values saves substantial bandwidth, it is desirable on a periodic basis to transmit an update of the electrical characteristics as a manner of confirming the sensed electrical characteristics and also confirming communication between the data logging device 700 and the network based computing device 710. Still part of the data is not otherwise transmitted because it is within the normal operating conditions including the error band. By way of example, a data packet may include a 32 bit time stamp, and 8 bit value, and transmission overhead, such a TCP/IP, UDP, IP, HTTP, etc.

When the data logging device and/or the network based computing device receives additional temporal electrical characteristics, it may update its expected operating conditions of the electrical device including an error range, as desired. In addition, if one of the data logging device and/or the network based computing device updates its expected operating conditions of the electrical device including an error range it should provide a communication to the other device to likewise update its characteristics in a similar manner.

The data logging device and/or the network based computing device may further base the expected operating conditions including the error range upon further characteristics. Such further characteristics may include for example, the ambient temperature proximate the electrical device, the weather, the building occupancy, the day of the week, the time of the day, and the season.

The terms and expressions which have been employed in the foregoing specification are used in as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A system for monitoring an electrical device comprising:
   a sensor configured to receive data representing an electrical quantity from the electrical device, the electrical quantity being indicative of an energy use of the electrical device; and
   a processor configured to:
      receive an expected value of the electrical quantity and an error band about the expected value, the error band representing an expected temporal variation in the electrical quantity;
      determine whether to update the error band based on one or more conditions within a building;
      determine when the received data representing the electrical quantity is outside the error band, wherein the received data representing the electrical quantity being outside the error band is indicative of an inefficiency of the electrical device; and
      send the received data representing the electrical quantity when the received data representing the electrical quantity is outside of the error band.

2. The system of claim 1, wherein the processor is further configured to:
   not send the received data representing the electrical quantity when the received data representing the electrical quantity is within the error band.

3. The system of claim 1, wherein the processor is further configured to:
   receive an updated error band, wherein the updated error band is based on data previously sent by the processor.

4. The system of claim 1, wherein the one or more conditions within the building comprise an occupancy of the building, and an environment of the building.

5. The system of claim 1, wherein the error band is based on an expected range of the electrical quantity from the electrical device.

6. The system of claim 1, wherein the processor is further configured to:
   update the error band in response to determining to update the error band.

7. The system of claim 6, wherein the processor is further configured to:
   send the updated error band.

8. The system of claim 6, wherein the processor is further configured to:
   determine when the received data representing the electrical quantity is outside the updated error band; and send the received data representing the electrical quantity when the received data representing the electrical quantity is outside of the updated error band.

9. A computer-implemented method comprising:
receiving data representing an electrical quantity from a sensor coupled to an electrical device, the electrical quantity being indicative of an energy use of the electrical device;
receiving an expected value of the electrical quantity, and an error band about the expected value, the error band representing an expected temporal variation in the electrical quantity;
determining whether to update the error band based on one or more conditions within a building;
determining when the received data representing the electrical quantity is outside the error band, wherein the received data representing the electrical quantity being outside the error band is indicative of an inefficiency of the electrical device; and
sending the received data representing the electrical quantity when the received data representing the electrical quantity is outside of the error band.

10. The computer-implemented method of claim 9, further comprising:
not the received data representing the electrical quantity when the received data representing the electrical quantity is within the error band.

11. The computer-implemented method of claim 9, further comprising:
receiving an updated error band, wherein the updated error band is based on data previously sent by a processor.

12. The computer-implemented method of claim 9, wherein one or more conditions within the building comprise an occupancy of the building, and an environment of the building.

13. The computer-implemented method of claim 9, wherein the error band is based on an expected range of the electrical quantity from the electrical device.

14. The computer-implemented method of claim 9, further comprising:
updating the error band in response to determining to update the error band.

15. A non-transitory computer readable medium storing instructions that when executed cause a processor to perform operations comprising:
receiving data representing an electrical quantity from a sensor coupled to an electrical device, the electrical quantity being indicative of an energy use of the electrical device;
receiving an expected value of the electrical quantity, and an error band about the expected value, the error band representing an expected temporal variation in the electrical quantity;
determining whether to update the error band based on one or more conditions within a building;
determining when the received data representing the electrical quantity is outside the error band, wherein the received data representing the electrical quantity being outside the error band is indicative of an inefficiency of the electrical device; and
sending the received data representing the electrical quantity when the received data representing the electrical quantity is outside of the updated error band.

16. The non-transitory computer readable medium of claim 15, wherein the processor is further configured to:
not send the received data representing the electrical quantity when the received data representing the electrical quantity is within the error band.

17. The non-transitory computer readable medium of claim 15, further comprising:
receiving an updated error band wherein the updated error band is based on data previously sent by the processor.

18. The non-transitory computer readable medium of claim 15, wherein one or more conditions within the building comprise an occupancy of the building, and an environment of the building.

19. The non-transitory computer readable medium of claim 15, wherein the error band is based on an expected range of the electrical quantity from the electrical device.

20. The non-transitory computer readable medium of claim 15, wherein the processor is further configured to:
update the error band in response to determining to update the error band.

* * * * *

UNITED STATES PATENT AND TRADEMARK OFFICE
CERTIFICATE OF CORRECTION

PATENT NO. : 10,778,773 B2
APPLICATION NO. : 16/241207
DATED : September 15, 2020
INVENTOR(S) : Zac Wheeler Page 1 of 1

It is certified that error appears in the above-identified patent and that said Letters Patent is hereby corrected as shown below:

In the Claims

Column 7, Line 9: In Claim 9, delete "quantity," and insert -- quantity --, therefor.

Column 7, Line 25: In Claim 10, after "not" insert -- sending --.

Column 8, Line 8 (approx.): In Claim 15, delete "quantity," and insert -- quantity --, therefor.

Column 8, Line 30 (approx.): In Claim 17, delete "band" and insert -- band, --, therefor.

Signed and Sealed this
Tenth Day of November, 2020

Andrei Iancu
*Director of the United States Patent and Trademark Office*